United States Patent [19]

Gladish

[11] Patent Number: 4,514,130
[45] Date of Patent: Apr. 30, 1985

[54] SUBSTRATE ELEVATOR MECHANISMS

[75] Inventor: Gary W. Gladish, Buck Creek Township, Hancock County, Ind.

[73] Assignee: AT&T Technologies, Inc., New York, N.Y.

[21] Appl. No.: 447,376

[22] Filed: Dec. 6, 1982

[51] Int. Cl.³ .................... B65G 25/00; B65G 65/02
[52] U.S. Cl. ................................. 414/416; 198/473; 198/485
[58] Field of Search .............. 414/222, 403, 416, 417; 118/730; 198/473, 680, 342, 477, 485; 204/298

[56] References Cited

U.S. PATENT DOCUMENTS

| | | | |
|---|---|---|---|
| 1,994,646 | 3/1935 | Heath | 198/477 |
| 2,868,354 | 1/1959 | Harrison | 198/477 |
| 3,033,345 | 5/1962 | Prymek | 198/473 |
| 4,118,993 | 10/1978 | Miyoshi et al. | 74/37 |

*Primary Examiner*—Joseph E. Valenza
*Assistant Examiner*—David A. Bucci
*Attorney, Agent, or Firm*—R. F. Kip, Jr.

[57] ABSTRACT

An improved elevator mechanism for transferring ceramic substrates between a magazine and a stepwise indexable rotatable cage in a sputtering chamber includes one or more of the following: (a) a substrate carrying tray having a round pick-up rod engageable by an elevator hook for lifting and lowering the tray into and out of the chamber, (b) a tab on the hook having formed therein a groove for receiving such pick-up rod, (c) a retaining tab on the hook for preventing separation between it and the tray in the event such rod becomes unseated in such groove, (d) an inclined plane for transferring the tray from the hook to the cage to initiate travel of the cage-held tray in the chamber as the cage progressively indexes, and (e) a lifting roller for transferring the tray at the end of such travel back to the hook.

8 Claims, 29 Drawing Figures

"X" CAGE INDEX

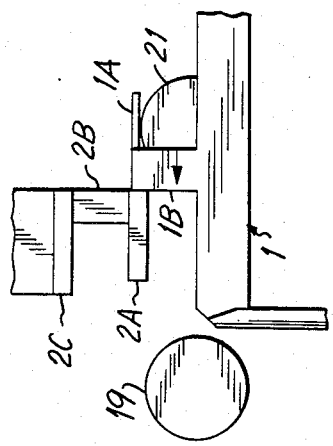

ELEVATOR TOO HIGH

TRAY TAB "1A" HITS EDGE OF ELEVATOR TAB "2A" AS IT LEAVES THE LIFTING ROLLER "21" RATHER THAN BEING LOWERED ON TO ELEVATOR TAB.

PRIOR ART
FIG. 14C

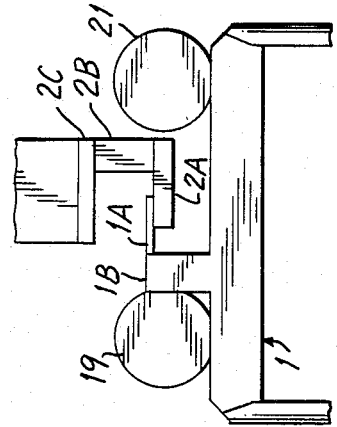

ELEVATOR TOO LOW

TRAY TAB "1A" HITS LIFTING ROLLER "19" ON A POINT OF STEEP INCLINE. CAGE MAY BIND UP RATHER THAN LIFT TRAY UP OVER ROLLER.

PRIOR ART
FIG. 14B

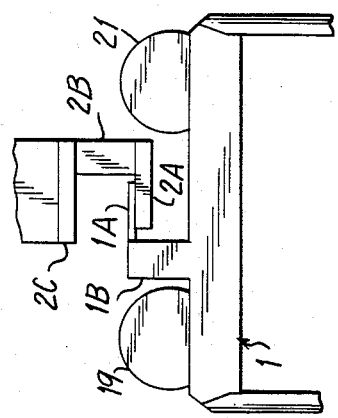

PROPERLY ADJUSTED ELEVATOR

HEIGHT DIFFERENCE BETWEEN ELEVATOR TAB AND TOP OF LIFTING ROLLERS IS 3/16". ELEVATOR HEIGHT IS 16 3/16".

PRIOR ART
FIG. 14A

SUBSTRATE ELEVATOR MECHANISMS

TECHNICAL FIELD

This invention relates generally to elevator mechanisms useful in manufacturing for transferring items from one place to another. More particularly, this invention relates to elevator mechanisms of such kind for transferring ceramic substrates from a magazine therefor to a sputtering chamber and, after completion of sputtering, from such chamber back to a magazine.

BACKGROUND OF THE INVENTION

In the manufacture of thin film integrated circuits, substrates in the form of rectangular ceramic wafers are (1) transferred from a magazine into a sputtering chamber within which a thin coating of metal is sputtered onto the substrates, (2) transferred on completion of the sputtering back to a magazine and then (3) processed by the use of photolithographic and other techniques to convert such coated substrates into such circuits.

Sputtering of the metal coating onto the substrates is effected within the mentioned chamber by: maintaining a vacuum therein and providing therein a negatively charged sputtering cathode which ionizes the rarefied arson atmosphere which, in turn, erodes the metal cathode causing such metal to be deposited on the substrates, and exposing the substrates to such deposition for a predetermined time so as to render the metal coating thereon of a predetermined desired thickness. Such fixed time of exposure is obtained by positioning the substrates seriatim at the sides of a polygonal stepwise-rotatable cage in the chamber, and by indexing the cage step-by-step so as to move the substrates in the chamber for a fixed time along a fixed length path which begins at a transfer station at which the uncoated substrates originally enter the chamber, and which closes on itself to eventually return to such station from which the now coated substrates are then removed from such chamber. An elevator mechanism is commonly used for conveying uncoated substrates to the chamber from a magazine and for conveying the coated substrates from the chamber back to a magazine.

The original cylindrical sputtering machines made use of two elevators. The lower elevator pushed the tray up from the main chamber into the sputtering chamber and supported the tray as the cage indexed. The upper elevator pushed the tray down from the sputtering chamber into the magazine in the lower chamber. As an improvement, cylindrical sputtering machines developed earlier by others have made use of only one elevator in which the functions of the two previous elevators were combined. The single elevator design simplified maintenance and improved reliability. It too, however, had its shortcomings resulting from the elevator and tray tab and other designs.

SUMMARY OF THE INVENTION

Such shortcomings are avoided according to the invention in one of its aspects by providing a tray tab in the form of a solid or tubular rod having a cylindrical underside adapted by being engaged with the elevator tab of a hook to be lifted and lowered such that the tray is correspondingly moved for purposes of effecting transfer of its substrates between a magazine and the sputtering chamber. According to another of such aspects, the elevator tab by which the hook engages the mentioned rod is in the form of a solid or hollow bar having formed in its upper side a cylindrical groove adapted to matingly receive and engage with the cylindrical underside of such rod so as to provide an areal contact bearing surface therefor in the course of lifting and lowering of the tray by the hook. As still another aspect of the invention, the hook may have a retainer tab for preventing separation of the tray tab and elevator tab in the event the rod of the former becomes unseated from the groove of the latter. As yet further inventive aspects, the tray is unloaded from the hook when both reach the sputtering chamber by inclined plane means, and the tray is loaded back onto the hook upon travel of the cage through one revolution by oversize roller means which first lifts and tray and then lowers it onto the hook.

The invention in many instances can best be comprehended by comparing its features with those of the one-elevator system earlier developed. Accordingly, the approach will be taken herein of first discussing such earlier system and then discussing the improvements thereon in accordance with the invention.

It should be appreciated that while, for convenience of disclosure, the discussion herein of the representative embodiment will be in terms of certain coordinate directions thereof, the invention as disclosed and claimed is not limited to any paticular geometric orientation.

BRIEF DESCRIPTION OF DRAWINGS

For a better understanding of the invention, reference is made to the following description of a representative embodiment thereof and to the accompanying drawings wherein:

FIGS. 14A, 14B and 14C are schematic diagrams in front elevation illustrative of the old arrangement at the upper transfer station for loading substrate trays off of and onto the elevator tab of the hook;

DETAILED DESCRIPTION OF EMBODIMENT

Figure 1:
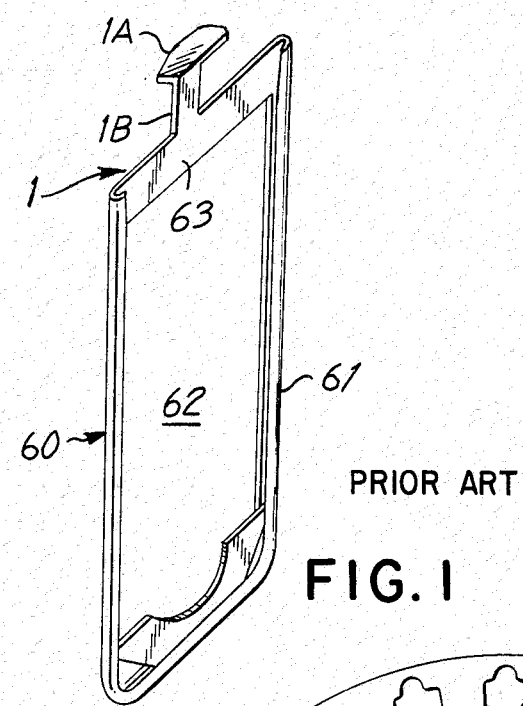
FIG. 1 is an isometric view of a substrate tray having a tray tab of the old design.
Figure 7:
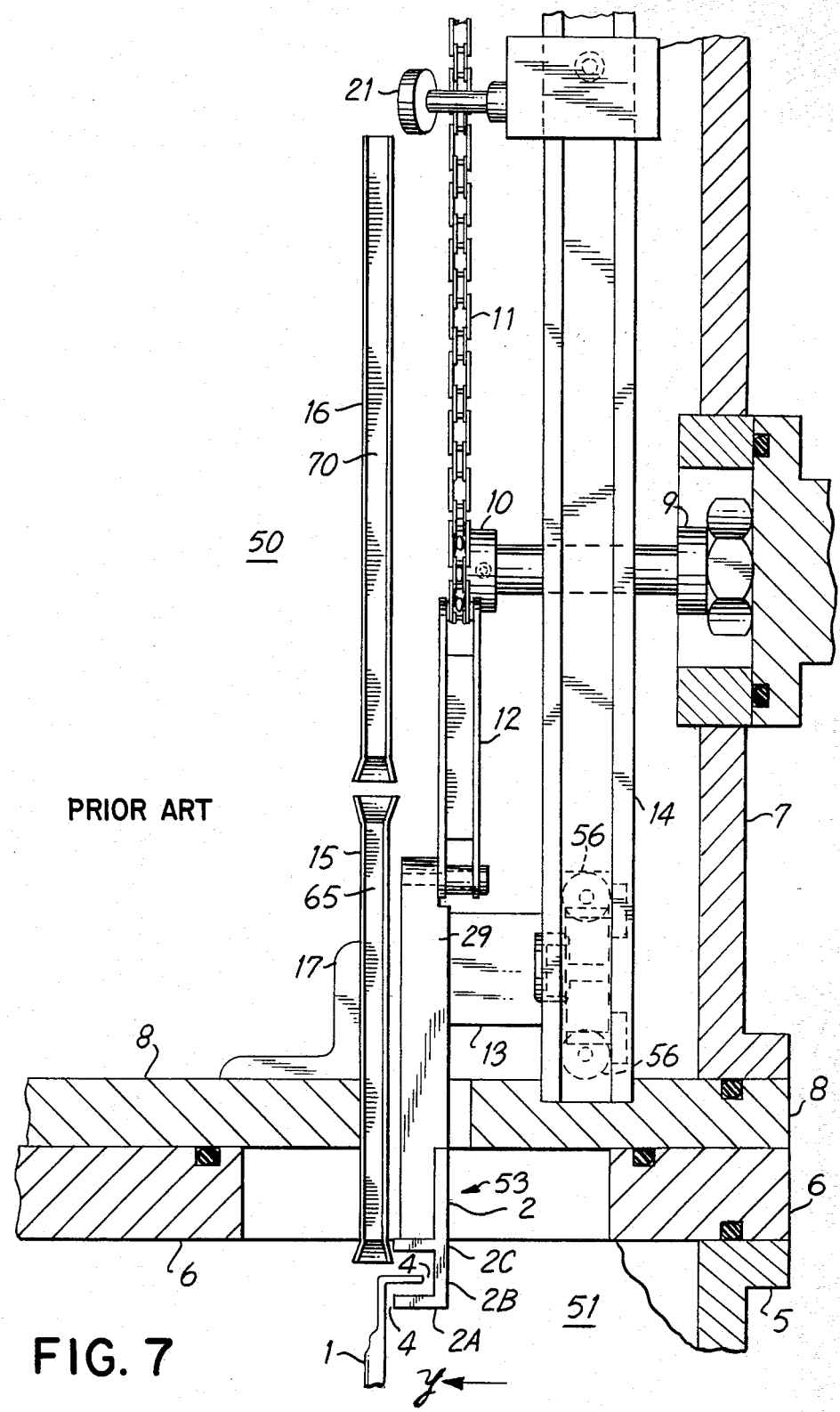
FIG. 7 is a right side elevation of the FIG. 6 ensemble plus part of said cage, portions of the FIG. 7 ensemble being sectioned or broken away to clarify the showing.

Cylindrical sputtering machines have two large chambers 50 and 51 (FIG. 7). The uppermost and slightly smaller chamber 50 is where the deposition occurs and is called the sputtering chamber. In this chamber, the trays 1 (see FIG. 1) (each tray holding two $4\frac{1}{2}'' \times 3\frac{3}{4}''$ substrates) are arrayed in a sixteen sided regular polygon or cage 16 (FIG. 8) (one tray per side) around the cathode (not shown).

Figure 2:
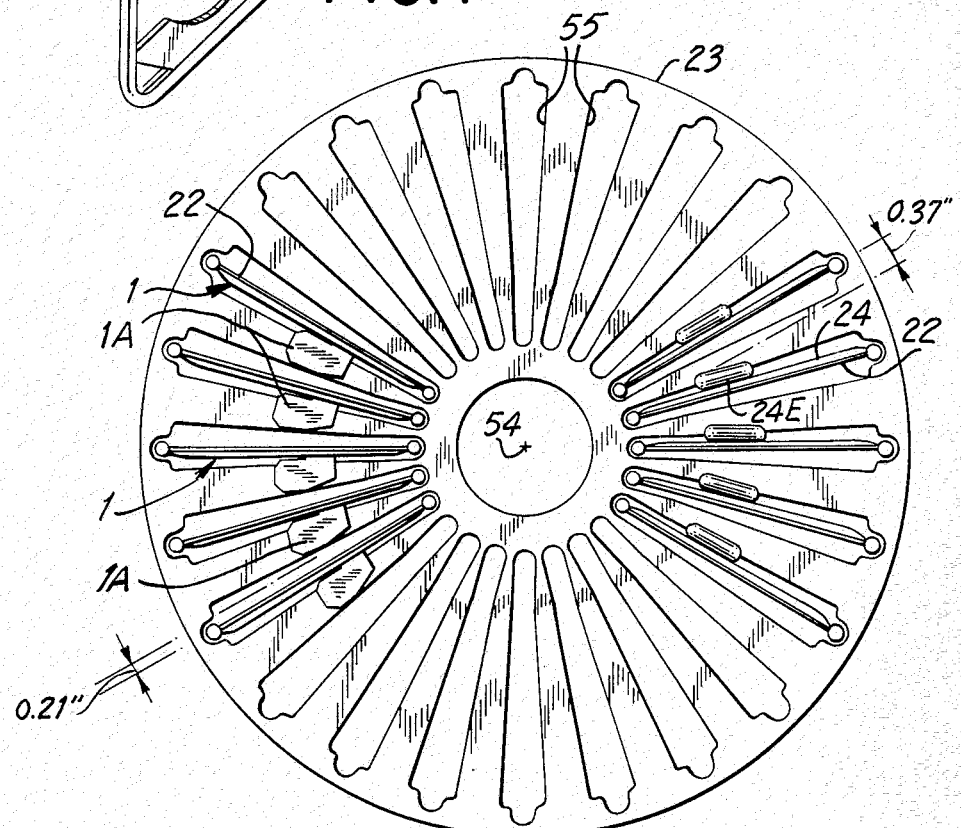
FIG. 2 is a schematic plan view of a magazine for substrate trays, the magazine being shown as partly loaded with trays having tabs of the old design and trays having tabs of the new design.
Figure 3:
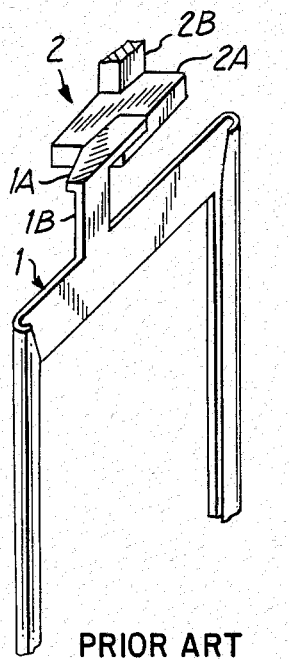
FIG. 3 is an isometric view of the FIG. 1 old design tray as engaged by a hook of the old design, only part of such hook being shown.

The lower and slightly larger chamber is called the main chamber. Its function, along with the load lock (a small, separately sealable chamber integral to the main chamber and not shown), is to bring into and out of the vacuum of the sputtering facility as many substrates as possible in a given time period. In this main chamber, the trays are carried in radial open-topped slots 55 in magazines 23 (FIG. 2). Each magazine carries twenty-four trays arranged radially around the vertical axis 54 of the magazine.

Figure 4:
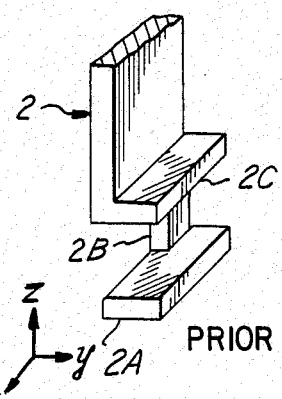
FIG. 4 is an isometric view showing further details of the FIG. 2 hook.
Figure 5C:
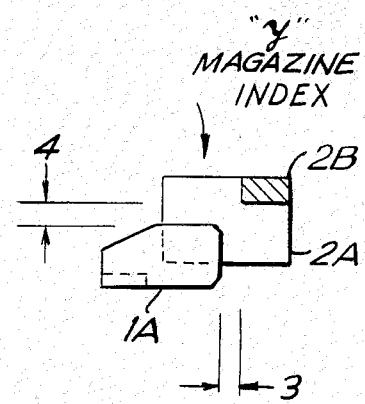
FIGS. 5A, 5B and 5C are schematic views of the FIG. 1 tray and FIG. 4 hook, those views being respectively a front elevation, right side elevation and plan view in cross-section, the latter being taken as indicated by the arrows 5C—5C in FIG. 5A.
Figure 5A:
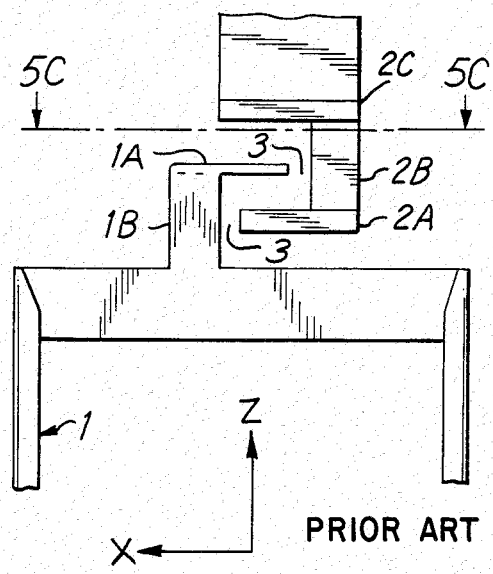
Figure 5B:
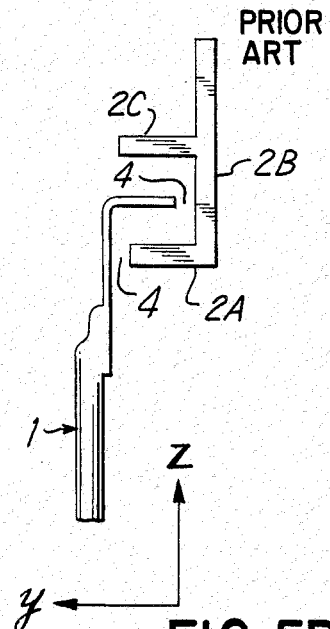
Figure 6:
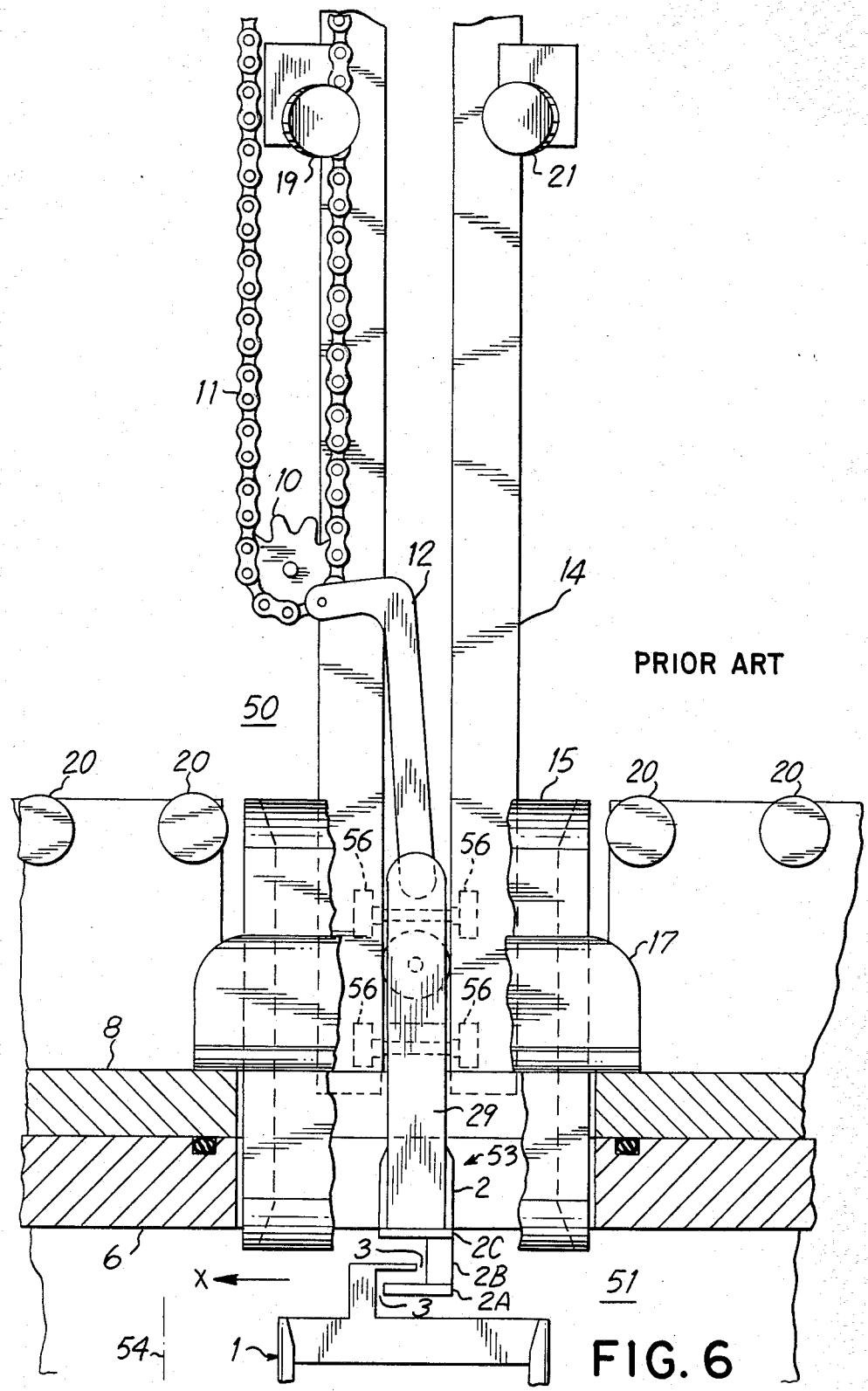
FIG. 6 is a front elevation of an ensemble comprising the lower part of an elevator mechanism for a substrate sputtering facility and part of such facility excluding the sputtering chamber cage, the FIG. 1 tray and FIG. 4 hook being shown, and portions of the ensemble being sectioned or broken away to clarify the showing.

The function of the elevator 53 (FIGS. 6, 7, 8) is to lift at a lower transfer station a tray of fresh product out of the magazine in the main or lower chamber up to an upper transfer station and into the cage in the sputter chamber, support it while the cage indexes once about its vertical axis, and then push a tray, of sputtered substrates down out of the cage and into the magazine below. Then the magazine indexes and the cycle starts again. To accomplish this, an elevator tab has been devised that effects movement of the tray in the "z" direction (up and down) but leaves the tray free to move in the lateral or "x" direction (cage index) and the transverse or "y" direction (magazine index) (see FIGS. 4 and 5).

With the elevator in the down position (see FIGS. 6 and 7), the tray 1 sits in the magazine 23 (FIG. 2) which is in the main chamber. The main chamber 51 is bounded by the main chamber cylinder 5, the main chamber top plate 6, a bottom plate (not shown), and several peripheral attachments. The sputter chamber 50 is bounded by the sputter chamber cylinder 7, and the sputter chamber bottom plate 8, a top plate (not shown), and peripheral attachments.

An elevator drive motor (not shown) is located outside the vacuum chambers. Torque from the drive motor is fed through the wall of the sputtering chamber by a ferro-fluidic vacuum rotary feedthrough 9 to a chain drive sprocket 10. The drive sprocket 10 drives endless belt conveyor means in the form of the chain 11 which drives the connecting web 12 which drives the elevator dolly 13 and elevator dolly arm 29. An elevator hook 2 is attached to the elevator dolly arm 29. The rollers 56 on the elevator dolly 13 ride inside channels in the elevator column 14 which serves as a guide to keep the hook 2 aligned.

The old design tray 1 (FIG. 1) comprises a vertically oriented frame 60 including a channel member 61 which is of U-cross section in planes normal to its centerline, and which is bent into the form of a rectangular "U" to outline a receptacle space 62 of the same shape. The upper ends of member 61 are joined by a horizontal cross-piece 63 to which is joined a lug 1B projecting upwards from frame 60 and disposed nearer to its left hand side than to its right hand side. Attached to the top of lug 1B is a flat tray tab 1A. In use, substrates 22 are slipped down into the U-grooves provided by member 61 on opposite sides of frame 60 so as to be held by that member in receptacle space 62. Preferably, there are two of such substrates although, if desired, the frame may accommodate only one long substrate.

With the elevator in the down position, a tray 1 with an old design tab 1A has such tab positioned between lower and upper elevator tabs 2A and 2C on the hook 2. The clearance 3 (see FIG. 5C) between tray tab 1A and the stem 2B of the elevator tab allows the magazine to index (motion in the "y" direction). When the magazine indexes, it moves 15° around its axis (1/24th revolution) bringing a new tray into position over the elevator tab.

As the elevator rises from its lowermost position (FIGS. 6 and 7), the lower elevator tab 2A contacts the tray tab 1A and lifts the tray 1 out of the magazine, through the intermediate track 15, and into the cage 16. With the elevator in the up position (see FIG. 8), the clearance 4 (see FIG. 5C) allows the cage to index with the tray tab 1A passing past the upright 2B on the elevator tab (motion in the "x" direction).

Intermediate track 15 (FIGS. 7 and 8) comprises two laterally spaced vertical U-Channel members 65 fixedly coupled to the plate 8 by bracket 17 and disposed to have their U-grooves facing each other and spaced apart by slightly more than the lateral width of tray 1. In the course of the tray's upward movement towards cage 16 (or back down from such cage after it has completed one revolution), the laterally opposite sides of the tray are received in these grooves so that the tray is guided in such movement by track 15.

The cage 16 comprises (FIGS. 7 and 8) sixteen channel members 70 each of H-cross section in planes normal to their centerlines and secured at their tops to a circular rim 71 around which channel members 70 are equidistantly spaced to form a sixteen-sided polygon. The spacing between each two adjacent channel members 70 is slightly greater than the lateral width of each tray 1. Accordingly, each two such adjacent members provides by the grooves of their H-sections which face each other a receptacle for receiving and holding a substrate tray at a location at one of the sides of cage 16 such that the tray travels with the cage as it is indexed. That is, the channel members 70 constitute means responsive to the indexing of the cage for correspondingly laterally displacing forward the tray 1 held thereby so that the travel in each index step of the cage and tray are the same.

When the cage 16 starts to index (see FIG. 8), the tray 1 is supported by the lower elevator tab 2A. Before the tray tab 1A slides off the lower elevator tab 2A, it contacts the lifting roller 19. The tray tab 1A rides up on and across the lifting roller 19 which supports the tray during part of the index. By the time the tray tab 1A clears the other side of the lifting roller 19, the bottom of the tray 1 is over the tray support rollers 20. Then the tray 1, held in place by the cage 16, rides around the cathode (not shown) on a series of support rollers 20 until it completes its circuit and approaches the elevator position from the other side. As the tray approaches the elevator position on its last index, the tray tab 1A contacts another lifting roller 21 which lifts the tray 1 off the support rollers 20 and then lowers the tray tab 1A down onto the lower elevator tab 2A.

Figure 8:
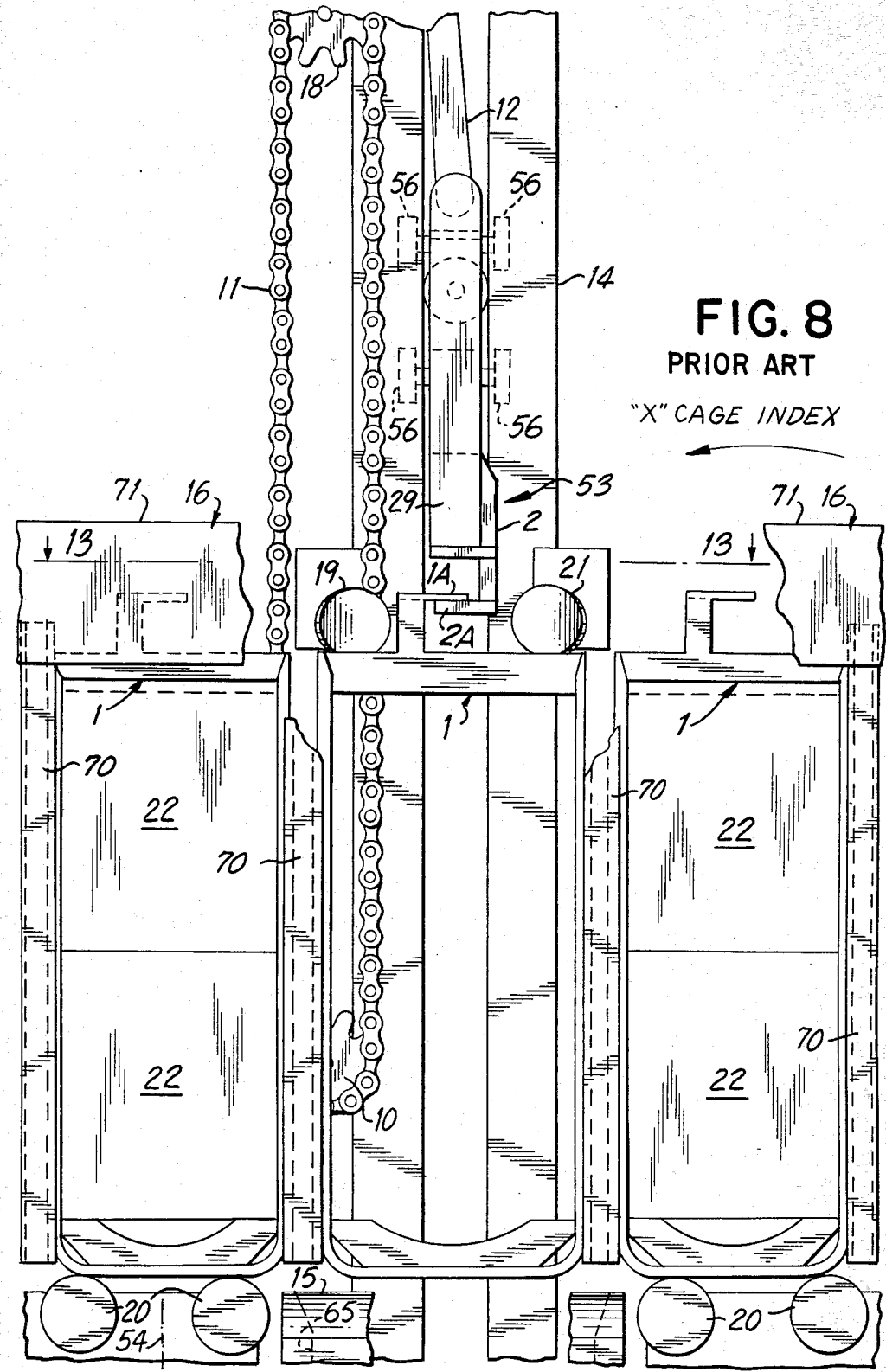
FIG. 8 is a front elevation of an ensemble comprising the upper part of the elevator mechanism and sputtering facility (including part of the sputtering chamber cage) of which the lower part of the ensemble is shown in FIG. 6; portions of the FIG. 8 ensemble being sectioned or broken away to clarify its showing.

The elevator then goes down pushing the tray 1 of sputtered product out of the cage 16, through the intermediate track 15, and into the magazine below. The magazine then indexes putting a new tray of product in position and the elevator raises it into the cage. In the described machine, the cage has, as stated, sixteen sides or locations. Each time the cage indexes the elevator goes down, taking a tray of sputtered product with it, and retrieves a new tray from the magazine below. Each tray 1 preferably (but not necessarily) holds two substrates 22. In FIG. 8, the substrates 22 are shown in the trays 1 on either side of the elevator, but have been removed from the tray in the elevator position to show more of the mechanical apparatus.

By reducing the number of moving parts, the single elevator design so far described is a substantial improvement over the earlier two-elevator designs. It too, however, has its shortcomings. Some of these shortcomings center on the design of the elevator and tray tabs and can be segregated into categories: machine jams and film scratches.

FIG. 2 shows a simplified top view of a sputtering magazine 23. In FIG. 2, five of the old trays 1 are shown on the left side of the magazine and five of the new trays 24 are shown on the right side of the magazine. The remaining fourteen slots in the magazine have been left blank.

Figures 9A, 9B:
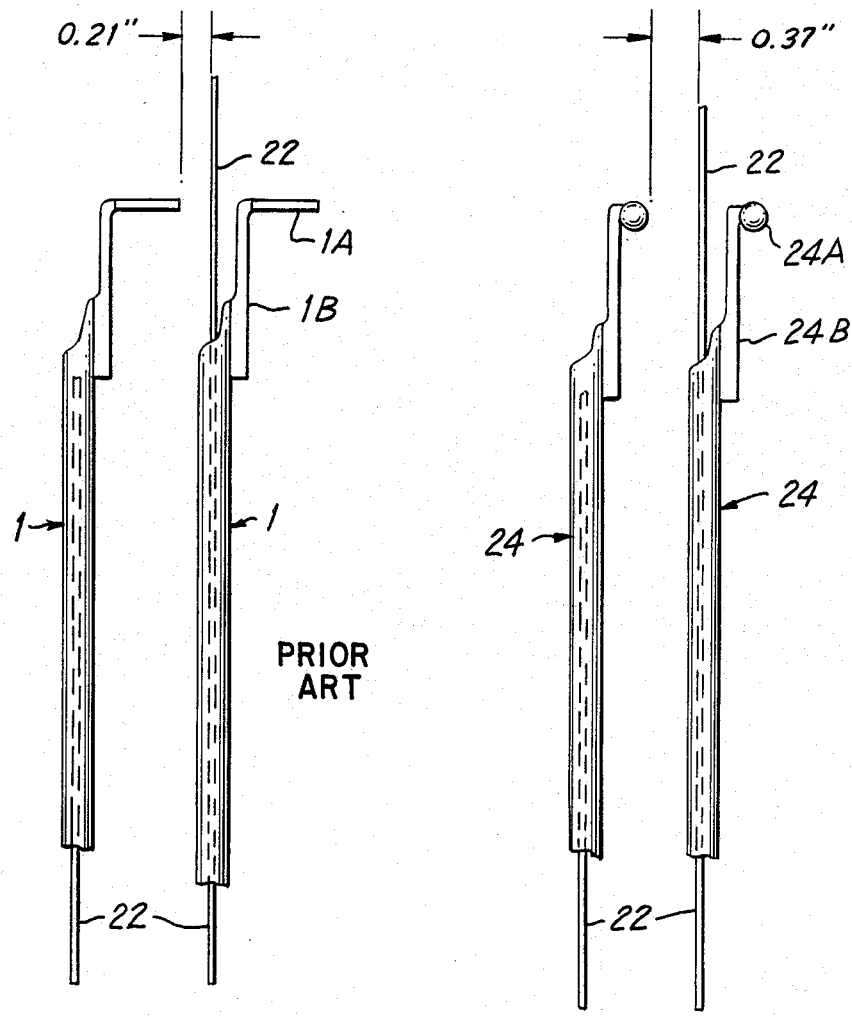
FIGS. 9A and 9B are schematic right side elevations illustrative of spacing relations between trays when unloaded from or loaded into the FIG. 2 magazine in the instances where the trays are of the old design (FIG. 9A) and the new design (FIG. 9B)

When the machine operator loads substrates into the trays or unloads substrates from the trays in the magazine, then the substrates 22 are moved vertically past the tray tab 1A on the adjacent tray (see FIGS. 9A and 9B). For the old tray, the normal distance between the adjacent tray tab and the film face of the substrate is only 0.21" (FIG. 9A). If the operator is not careful, the film face of the substrate can be scratched on the adjacent tray tab during loading and unloading.

The elevator moves the tray vertically from the magazine up into the cage and later lowers it vertically from the cage down into the magazine. As long as both the tray tab and the elevator tab remain perfectly flat and horizontal, the only component of force that is transferred from the elevator to the tray is a straight vertical force. However, as soon as either tab becomes slightly bent, the transfer of force from elevator to tray tab picks up a horizontal component as shown in FIGS. 10A and 10B.

Figure 10A:
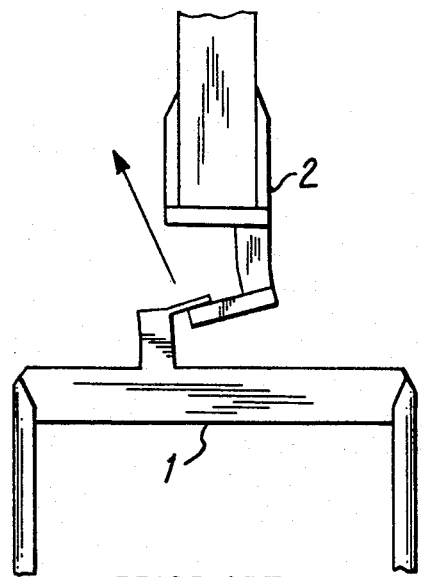
FIGS. 10A-10C inclusive are schematic diagrams illustrative of bendings of parts of the old design tray and hook (FIGS. 10A, 10B) and the new design tray and hook (FIG. 10C)
Figure 10B:
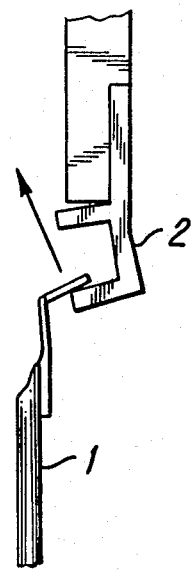

A horizontal component in the elevator force, as shown in FIGS. 10A and 10B, tends to make the tray lock up in the track as it tries to pass through the intermediate track 15 or a cage track between cage members 70; it tends to separate the tray tab and elevator tab or decrease their overlap; and, most importantly, it tends to further bend the tabs and thus further increase the horizontal component of the force. Thus a small bend in the tab can quickly become a large bend in the tab. One of the more common causes of jams in the described machine are bent tray tabs which cause the tray to lock up one or the other of such tracks or to fall off the elevator. Careful set up of the machine and inspection of the tabs helps to minimize such jams but such care is time consuming and not completely effective.

Figure 11A:
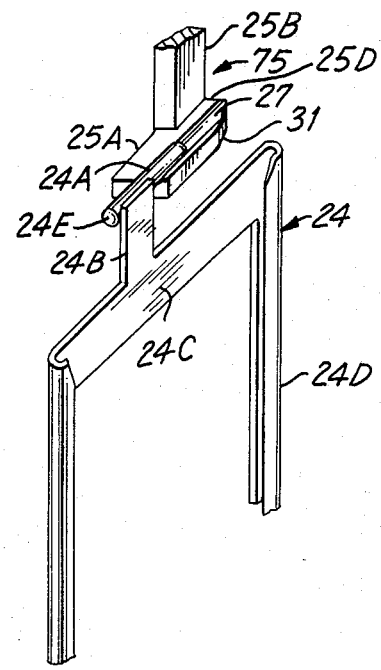
FIG. 11A is an isometric view of the new design tray and, also, of part of the new design hook without a tray retaining means.
Figure 11B:
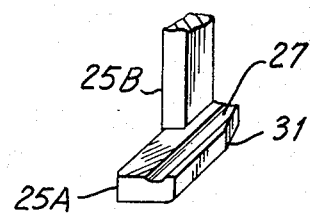
FIG. 11B is an isometric view of part of the FIG. 11A hook showing more clearly the groove formed therein.
Figure 11C:
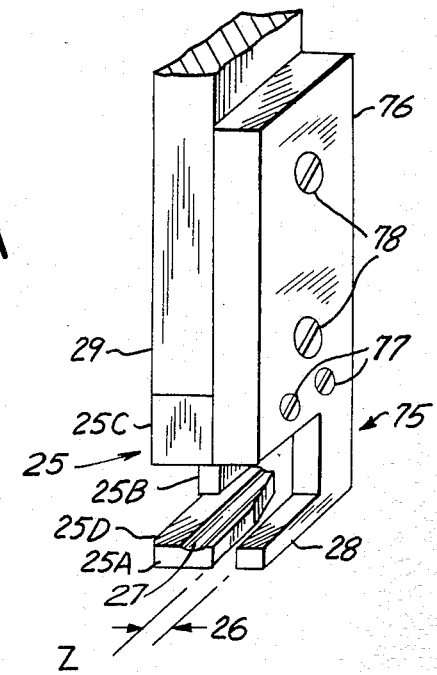
FIG. 11C is an isometric view of the new design hook when modified to include tray retaining means providing a retainer tab.

In the new tray design, the ½" wide flat tray tab 1A is replaced by a tray tab in the form of a portion of a 3/16" diameter round rod 24E (see FIG. 11). As shown in FIG. 11A, rod 24E is joined to a lug 24B to one side thereof adjacent its top, and lug 24B is in turn joined to the crosspiece 24C of the vertically oriented frame 24D of the new tray 24 so as to project upwards from that frame and to be nearer its left hand than its right hand side. Rod 24E is horizontally salient from lug 24B in the direction away from the left hand side of the frame, the portion of the rod which provides the new tray tab 24A being rightward of lug 24B and transversely and laterally offset from such lug and of a length so as to extend past the vertical centerline of the new tray 24. Such new tray differs from the old tray (FIG. 1) principally by having the described smaller round tab. The smaller tab provided by the rod increases the normal clearance between the film face of the substrates and the tab of the adjacent tray from 0.21" to 0.37" (see FIGS. 9A and 9B) or nearly 75%. If we assume that a tray tab can commonly be bent by as much as 0.10", then the new tray tab changes the minimum expected clearance from 0.11" to 0.27" or an increase in minimum clearance of more than 130%. This increased clearance substantially reduces scratches at the load-unload operation.

Simply reducing the width of the tray tab 24E from ½" to 3/16" without other changes would reduce the overlap between the tray tab and the elevator tab to the point where even minute misalignment would allow the tray to fall off the elevator and cause a jam. This is prevented by the use of a round rod for the tray tab and several changes instituted in the elevator hook.

Figure 12A:
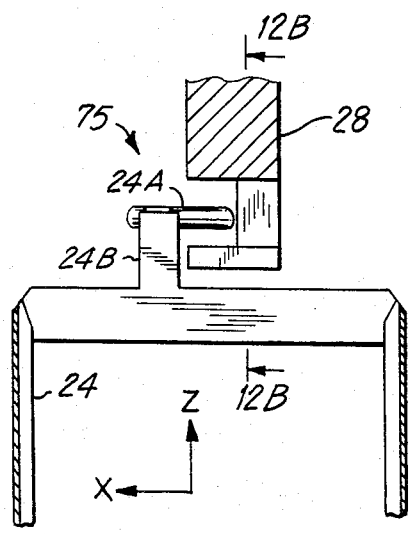
FIGS. 12A, 12B and 12C are various schematic sectional views illustrative of the cooperation between the new design tray and the new design hook, such views being, respectively, a front elevation in cross-section (FIG. 12A), a right side elevation in cross-section (FIG. 12B), and a plan view in cross-section (FIG. 12C), the sectioning in such views being effected as indicated by the sectioning lines and arrows in FIG. 12B.
Figure 12B:
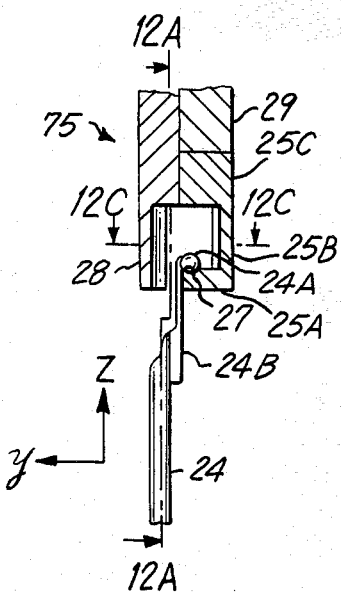
Figure 12C:
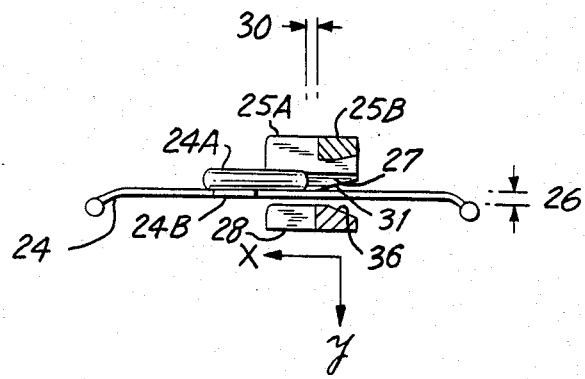

The new elevator hook 75 (see FIGS. 11A-11C and 12A-12C) uses a lower tab 25A which can be positioned in use below the tray tab or rod 24A. As shown (FIG. 11C) hook 75 comprises a part 25 providing an upper elevator tab 25C from the underside of which there projects downward a vertical stem 25B to the lower end of which is joined a bar 25D horizontally salient leftward from the stem and having leftward of the stem a portion transversely and laterally offset from the stem and providing the lower elevator tab 25A. Tab 25A has formed in its upper side a cylindrical groove 27 of the same diameter as and mating with the cylindrical underside of the rod tray tab 24A and adapted to receive and engage with such underside. The clearance 30 (FIG. 12C) between the tab and the stem 25B allows the magazine to index (motion in the "y" direction). As the hook 75 rises and contacts the tray, the round underside of the tray tab 24A nestles into the groove 27 in the lower elevator tab 25A. This groove provides an areal contact bearing surface for the tab and has a center depth of 0.021" and a radius of 3/32" (the same radius as the tray tab or rod 24A). The groove is 0.119" wide and subtends an arc of 78°.

Figure 10C:
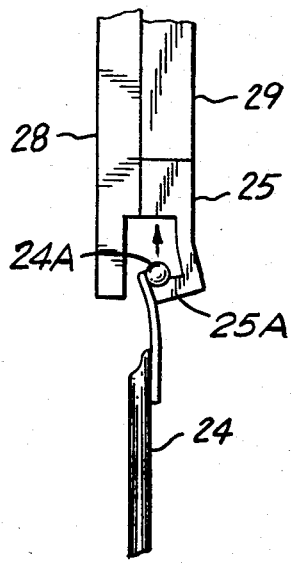

When the elevator tab 25A is perfectly flat, we may consider the bearing surface or point of contact between the tray tab 24A and the elevator tab 25A to be at the bottom of the groove. If the elevator lower tab 25A becomes somewhat bent (see FIG. 10C), then the load bearing point (still at the lowest point in the groove although no longer at the center) is moved closer to the edge of the groove. The load bearing point will, however, still be directly below the center of the tray tab 24A, and as such will exert only a vertical component of force on the tray. The load bearing point will remain in the groove, on its curved surface, and directly below the center of the tray tab 24A as long as any bend in the elevator tab does not exceed 39° (½ of 78°).

Because the tray tab 24A itself is round, it always presents the same surface of contact to the elevator tab and will not introduce any horizontal components of force regardless of the degree of bend in the tray tab. So for any bend in the elevator tab 25A of less than 39° and virtually any bend in the tray tab 24A, horizontal components of force and their attendant problems are not introduced by the movement of the elevator. This substantially reduces machine jams from these sources.

Figure 13:
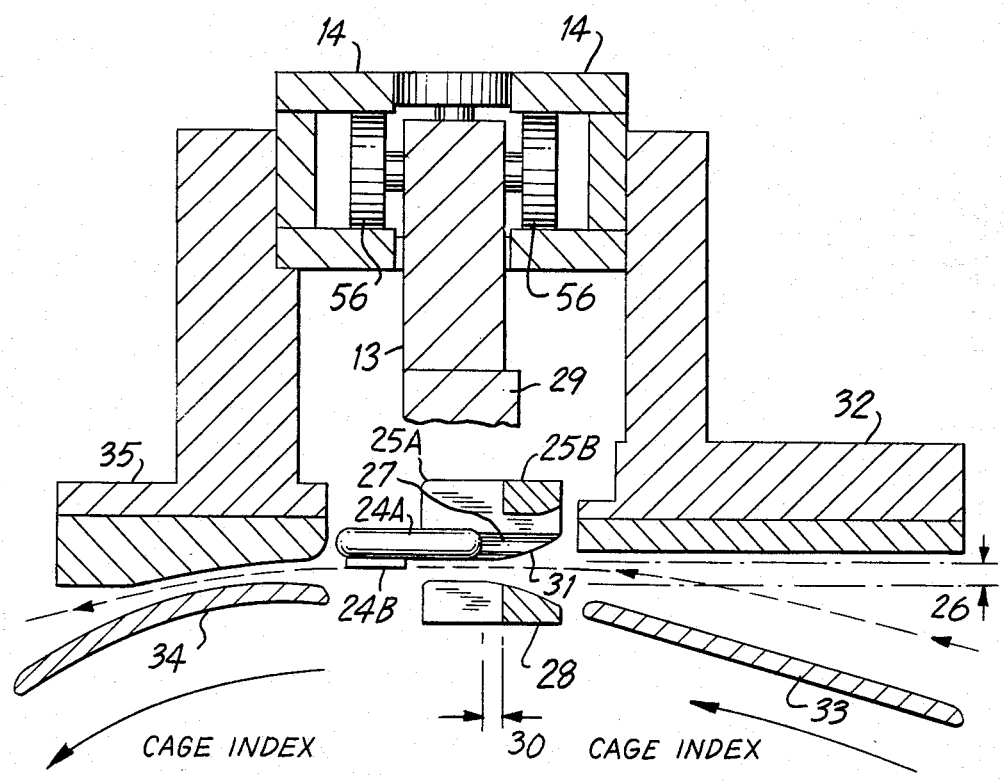
FIG. 13 is a plan view in cross-section, which would be taken as indicated by the arrows 13—13 in FIG. 8 if FIG. 8 were modified to incorporate the new design, FIG. 13 showing the relationship between the new design tray and hook and the upper part of the elevator mechanism and sputtering facility, and FIG. 13 also showing a new arrangement in such upper part for loading a tray onto the hook at the upper transfer station for the tray.
Figure 15A:
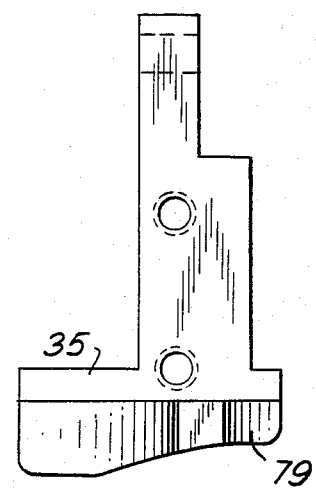
FIGS. 15A, 15B and 15C are, respectively, a plan view, left side elevation and front elevation of a guide and inclined plane means thereon used in the new arrangement shown by FIG. 13.
Figure 15B:
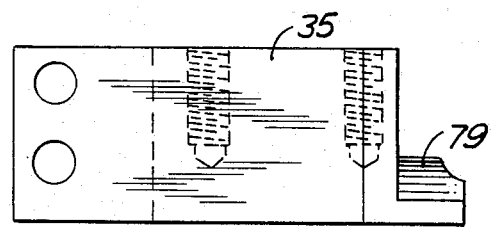
Figure 15C:
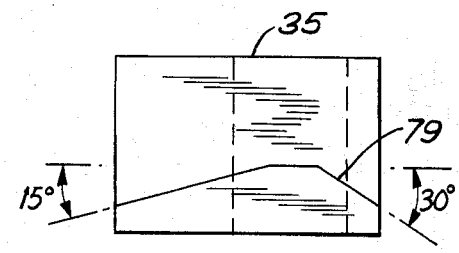

However, the reduction in the width of the tray tab from ¼" to 3/16" makes the need for proper alignment of the tray tab 24A more critical. To align the tray tab 24A as the cage 16 indexes it into position, a radiused lead-in 31 is machined on the lower elevator bar 25D and a retaining tab 28 (see FIGS. 11C, 12 and 13) is added to the elevator. Tray retainer tab 28 is part of a larger tray retaining means or member 76 which is (FIG. 11C) secured by screws 77, 78 to the upper elevator tab 25C and to the elevator dolly arm 29 so that the entire hook 75 (consisting of the part 25 and member 76) is fixedly fastened to such arm. Retainer tab 28 has formed therein (FIG. 12C) a lead-in 36 similar to the lead-in 31 on the bar 25D. The space 26 (FIG. 11C) between the elevator tab 25A and the retaining tab 28 is 0.135" to 0.140" wide. This gap is much too narrow for the 3/16" or 0.188" wide tray tab 24A to fall through should it be misaligned; yet it is still amply wide to allow passage of the 0.063" thick upright lug 24B of the tray tab as the cage 16 indexes (motion in the "x" direction).

The lead-ins 31 and 36 provided on the lower elevator tab 25A and the retaining tab 28 are sufficient to align a tray tab 24A and lug 24B that together are no more than 0.134" out of alignment. To assure that tray tabs and lugs are within this range when presented to the elevator tab and retainer tab combination (see FIG. 13), a set of fixed guides 32 and 33 realign the more divergent tabs as the cage indexes them into the elevator position. Another set of guides 34 and 35 provides alignment if it is necessary to back up the cage. These two guides 34 and 35 also double as a lifting mechanism which will be discussed hereinafter.

In the old elevator arrangement (see FIG. 8), the tray was lifted off the elevator tab by one lifting roller 19 and lowered back onto the elevator tab by another lifting roller 21. FIGS. 14A, 14B and 14C show the results of having the elevator height misadjusted. In FIG. 14A, such height is properly adjusted. In FIG. 14B, the elevator is too low causing a tray tab 1A for a tray being transferred to the cage to hit the lifting roller 19 on a point of steep incline and thus causing the cage to bind up rather than to index. In FIG. 14C, the elevator is too high causing a tray tab 1A for a tray being removed from the cage to hit the edge of the lower elevator tab 2A and again causing the cage to jam.

The top 71 of the cage 16 is frequently out-of-round. This, in combination with slight bends in the tray tabs 1A, allows the tray tabs 1A to occasionally slide past the lifting rollers 19 and 21 rather than riding over the top of them. When the tray tab 1A misses the lifting roller 19 as the tray leaves the elevator position, then the rounded corners on the bottom of the tray 1 (see FIG. 1) will normally serve as the lifting surface for the tray and allow the cage to index with only a momentary hang-up. When the tray tab 1A misses the lifting roller 21 as the tray comes into the elevator position, then the tray tab 1A will hit the edge of the elevator tab 2A and lock up the cage unless the elevator tab 2A is low enough to be below the rest height of the tray tab 1A. The rest height (16 3/16" above the sputter chamber floor) of the tray tab 1A is the height at which it rides when the tray 1 is supported from underneath by the tray support rollers 20 (see FIG. 8).

In the new elevator arrangement, the two lifting rollers 19 and 21 have been eliminated. The first lifting roller 19 has been replaced by an inclinded plane 79 (see FIGS. 13 and 15A 15B, 15C) formed as a shoulder on the front of guide 35. The inclined plane 79 provides a constant lift angle of 30° from a minimum elevator height of 16.08" up to 16.30". This extends the lower end of the range for allowable elevator height from 16.166" down to 16.083", an extension of 0.083".

Figure 16:
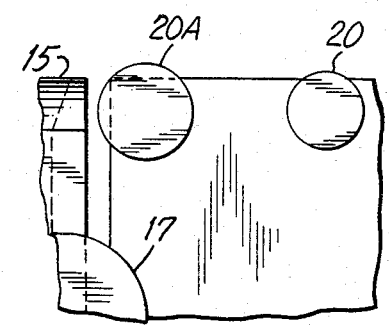
FIG. 16 is a fragmentary front elevation view of the right hand portion of the FIG. 6 ensemble as modified to incorporate a last support roller of enlarged diameter.

On the other side of the elevator position, the lifting roller 21 has been removed and last support roller 20 (see FIG. 6) has been replaced by a roller 20A of ⅛" larger diameter (see FIG. 16). This raises the tray from underneath and thus extends the upper end of the range for allowable elevator height by 1/16". The support roller 20A is wide enough that the tray cannot miss it. The guides 34 and 35 (see FIG. 13) assure that the tray tab 24A cannot miss the lifting surface of the inclined plane 79.

The above described embodiment being exemplary only, it will be understood that additions thereto, omissions therefrom and modifications thereof can be made without departing from the spirit of the invention. For example, while numerous dimensions have been given for the representative embodiment described, the invention is not restricted to those dimensions or any one or more of them. Accordingly, the invention is not to be considered as limited save as is consonant with the recitals of the following claims.

What is claimed is:

1. An elevator mechanism for vertically transferring substrates between radial open-topped slots in a lower rotatable magazine and locations assigned to such substrates at the sides of an upper polygonal rotatable cage, said slots and locations being adapted by respective stepwise rotations of said magazine and cage about respective vertical axes therefor to be horizontally indexed transversely and laterally, respectively, past lower and upper transfer stations, respectively, and said mechanism comprising, a tray adapted to be transferred between said slots and locations and which comprises: a vertically oriented frame for receiving and holding at least one of said substrates, said frame having a center plane which is vertically and laterally oriented, a vertical lug joined to the top of said frame nearer to one of its vertical sides than the other and projecting upwards from said frame, and a horizontal rod joined to said lug on one side thereof adjacent its top in vertical spaced relation from said frame, said rod being parallel to said plane of said frame, and said rod providing as part thereof a tab for such tray, such tray tab being laterally and transversely offset from said lug and being on its underside of cylindrical form and said mechanism further comprising, a hook comprising a vertical stem and a horizontal elevator bar joined to said stem on one side thereof adjacent its bottom, such bar providing as part thereof an elevator tab horizontally salient from said stem in the direction opposite the salient direction of said tray tab from said lug, said elevator tab having an upper side laterally and transversely offset from said stem and having formed in such upper side a horizontally extending cylindrical groove disposed parallel to the plane of said frame and adapted to receive and engage with the underside of said tray tab so as to provide an areal contact bearing surface therefor, and such mechanism also comprising endless belt conveyor means to which the upper end of said hook is coupled, said conveyor means being adapted upon engagement of such tray tab's underside with the groove of such elevator tab to convey said tray between said station for purposes of transferring it and any associated substrate between said slots and said cage locations.

2. An elevator mechanism according to claim 1 in which the end of said horizontal elevator bar away from said elevator tab is formed so that the transversely front surface of such bar curves at that end towards the transversely rear surface thereof.

3. An elevator mechanism according to claim 1 or claim 2 in which said hook further comprises tray retaining means including a retainer tab extending parallel to said elevator tab in transversely spaced relation therefrom,, said tray retaining means providing between it and said stem and horizontal elevator bar a transverse gap laterally extending through said hook for providing passage therethrough of said lug and horizontal rod of such tray, and the portion of said gap between said retainer tab and said horizontal elevator bar having a transverse width greater than that of said lug but less than the combined transverse thickness of said lug and said horizontal tray rod so as to preclude downward slippage of said lug and rod through said gap.

4. An elevator mechanism for vertically transferring substrates between radial open-topped slots in a lower rotatable magazine and locations assigned to such substrates at the sides of an upper rotatable polygonal cage, said slots and locations being adapted by respective stepwise rotations of said magazine and cage about vertical axes therefor to be horizontally indexed transversely and laterally, respectively, past lower and upper transfer stations, respectively, and said mechanism comprising:

(a) a tray adapted to be transferred between said slots and locations and which comprises:
 (i) a vertically oriented frame for receiving and holding therein at least one of said substrates;
 (ii) a vertical lug joined to the top of said frame nearer to one of its vertical sides than the other and projecting upwards from said frame;
 (iii) a horizontal tray rod joined to said lug on one side thereof adjacent its top in vertical spaced relation from said frame, said rod providing as part thereof a tray tab horizontally salient from such lug in the direction towards said other side of said frame and extending past the vertical centerline thereof, said tray tab being laterally and transversely offset from said lug, and
(b) a hook comprising:
 (i) a vertical stem
 (ii) a horizontal elevator bar joined to said stem on one side thereof adjacent its bottom, such bar providing as part thereof an elevator tab horizontally salient from said stem in the direction opposite the salient direction of said tray tab from said lug, said elevator tab having an upper side laterally and transversely offset from said stem, and
 (iii) tray retaining means including a retainer tab extending parallel to said elevator tab in transversely spaced relation therefrom, said tray retaining means providing between it and said stem and horizontal elevator bar a transverse gap laterally extending through said hook for providing passage herethrough of said lug and horizontal tray rod of such tray, and the portion of said gap between said retainer tab and said horizontal elevator bar having a transverse width greater than that of said lug but less than the combined transverse thickness of said lug and said horizontal tray rod so as to preclude downward slippage of said lug and rod through said gap, and
(c) endless belt conveyor means to which the upper end of said hook is coupled, said conveyor means being adapted upon engagement of such tray tab side with such elevator tab to convey said tray between said stations for purposes of transferring it and any associated substrate between said slots and said cage locations.

5. An elevator mechanism according to claim 4 in which said tray on arrival at said upper transfer station is laterally disposed at one of said assigned locations in relation to said cage but remains coupled with said hook by virtue of the underside of said tray rod being seated in said groove in said elevator tab so that such tray rod hangs from said hook, said mechanism further comprising, means responsive to the indexing by each step of said cage for correspondingly laterally displacing said tray forward such that said tray travels with said cage, and stationery inclined plane means responsive to such a lateral displacement of said tray when it is at said upper station to contact said tray rod and to then wedge it upwardly so as to lift said tray from said hook.

6. An elevator mechanism according to claim 4 in which, as said cage indexes, said tray is carried in said cage above rollers disposed at fixed positions and supporting such tray from beneath, and in which the last roller encountered by said tray before returning to said hook for transfer back to said magazine is a roller of enlarged diameter serving to lift said tray and then lower it so as to deposit the tab thereof on the elevator tab of said hook.

7. An elevator mechanism according to claim 4 further comprising guide means laterally disposed to either side of said upper transfer station for aligning said tray in relation to said hook when said hook initially transferred from said hook to said cage and, later, is transferred from said cage back to said hook.

8. An elevator hook for vertically transferring trays which carry substrates between a magazine for such trays and a sputtering chamber, such hook comprising, a vertical shank, an elevator member at the lower end of and coupled to said shank and providing on its upper side a laterally extending surface for engaging with the underside of a horizontally projecting part of such a tray so as to support such tray from such hook with an upper portion of said tray joined to said horizontally projecting part and extending vertically down past a lateral side of said elevator member, and so as thereby to permit such tray to be moved vertically by said hook, and a retainer member coupled to said shank and disposed laterally and vertically opposite said first member's lateral side and transversely offset therefrom by a gap adapted to receive said upper portion of such tray when so supported from said hook, and said retainer member being adapted by contacting said upper portion to inhibit horizontal separation of said tray and hook in the event of dislodgement of said part of said tray from said elevator member.

* * * * *